United States Patent
Shkel et al.

(10) Patent No.: US 9,611,138 B2
(45) Date of Patent: Apr. 4, 2017

(54) THROUGH-WAFER INTERCONNECTS FOR MEMS DOUBLE-SIDED FABRICATION PROCESS (TWIDS)

(71) Applicant: The Regents of the University of California, Oakland, CA (US)

(72) Inventors: Andrei A. Shkel, Irvine, CA (US); Alexandra Efimovskaya, Irvine, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 14/881,058

(22) Filed: Oct. 12, 2015

(65) Prior Publication Data

US 2016/0167958 A1 Jun. 16, 2016

Related U.S. Application Data

(60) Provisional application No. 62/063,559, filed on Oct. 14, 2014.

(51) Int. Cl.
*H01L 21/768* (2006.01)
*B81B 7/00* (2006.01)
*H01L 21/02* (2006.01)

(52) U.S. Cl.
CPC ...... *B81B 7/0074* (2013.01); *H01L 21/02118* (2013.01); *H01L 21/76877* (2013.01); *H01L 21/76898* (2013.01); *B81B 2207/07* (2013.01)

(58) Field of Classification Search
CPC ......... H01L 21/02436; H01L 21/02518; H01L 21/54; H01L 21/70; H01L 21/702; H01L 21/71
See application file for complete search history.

(56) References Cited

U.S. PATENT DOCUMENTS

2012/0267773 A1* 10/2012 Ebefors ............... B81B 7/007
257/692

* cited by examiner

*Primary Examiner* — Cheung Lee
(74) *Attorney, Agent, or Firm* — Marcus C. Dawes; Daniel L. Dawes

(57) ABSTRACT

A high-aspect ratio low resistance through-wafer interconnect for double-sided (TWIDS) fabrication of microelectromechanical systems (MEMS) serves as an interconnection method and structure for co-integration of MEMS and integrated circuits or other microcomponent utilizing both sides of the wafer. TWIDS applied to a three dimensional folded TIMU (timing inertial measurement unit) provides a path for electrical signals from sensors on the front side of the SOI wafer to electronic components on the back side of the wafer, while enabling folding of an array of sensors in a three dimensional shape.

19 Claims, 9 Drawing Sheets

THROUGH-WAFER INTERCONNECTS FOR MEMS DOUBLE-SIDED FABRICATION PROCESS (TWIDS)

GOVERNMENT SUPPORT

This invention was made with government support under N66001-13-1-4021, funded by DARPA/MTO and contracted by Navy, Space & Naval Warfare Systems Command, the government has certain rights in the invention.

RELATED APPLICATIONS

This application is related to provisional patent application, entitled, "THROUGH-WAFER INTERCONNECTS FOR MEMS DOUBLE-SIDED FABRICATION PROCESS (TWIDS)", Ser. No. 62/063,559, filed on Oct. 14, 2014, under 35 USC 119, which is incorporated herein by reference.

BACKGROUND

Field of the Technology

The disclosure relates to the field of micro-electro-mechanical systems (MEMS), and more particularly to through-wafer interconnects for three dimensional packaging of MEMS devices Description of the Prior Art High-aspect ratio through-wafer interconnects technology has a wide spectrum of applications, ranging from multilayer interconnects in integrated circuits to three dimensional packaging of MEMS sensors. The through-wafer interconnects are typically intended to allow for co-integration of MEMS and integrated circuits by utilizing the front and back side of a wafer. The main challenges for through-wafer interconnect for three dimensional MEMS structures include reduction of via size, low resistance and compatibility with standard semiconductor processing. Via diameter is limited by the electrical contact pad size, which should not exceed 100-200 µm for most MEMS sensors applications. Several approaches have been developed in literature for fabrication of through wafer interconnects, and the strategy for making the via can be divided into two groups. In the first group, through-wafer interconnects are formed by the wafer material, e.g. a doped silicon via. US Patent Pub. 2013/0146994 discloses the method for manufacturing a hermetically sealed structure with silicon through-wafer interconnects. The method for forming vertical via comprises the steps of: patterning and partially etching through the silicon wafer; filling the recesses with an insulator material, like glass or silicon dioxide; removing excess silicon; and depositing a thin metal layer, such as titanium or aluminum, on the silicon parts.

An article entitled "High Density Through Wafer Via Technology", by T. Bauer, NSTINanotech 2007, Vol. 3, 2007, proposes an idea to isolate a section of a low resistivity silicon wafer laterally by incorporating a trench filled with an isolating material. This isolating trench will most often have the shape of a square or a circle but could also take other shapes if necessary as long as it constitutes a closed loop. The process begins with the formation of the trench using a DRIE process, achieving the necessary high aspect ratio features in up to 600 µm thick substrates. Typical trench width is on the order of 10 to 15 µm. Following the trench etch, the wafer is subject to a high temperature filling of the trenches by a dielectric material. Finally, a chemical-mechanical planarization (CMP) process is applied to the backside of the wafer.

In the second group of prior techniques, a vertical via hole is formed in the wafer using, for example, the Bosch process, followed by an insulating layer and conductive layer deposition. In some cases the conductive layer, like highly doped polysilicon is applied to serve as a via electrical connection itself. In other cases the conductive layer provides a seed for subsequent metal electroplating process. An electroplating process is then used to fill the vertical vias with metal, e.g. copper. In some cases a conductive seed layer is not applied to the via wafer, and then the electroplating process requires using a sacrificial wafer bonded to the through hole via wafer. A sacrificial wafer is usually covered with a thin metal layer to serve for initiating the plating process.

US Pat. Pub. 2010/0052107 teaches the method for fabricating through-wafer interconnects using a molten material with low resistivity drawn into the via holes. The method starts with DRIE etching of via holes in the silicon wafer. After having provided the holes of the desired configuration, the substrate is subjected to a process such that the substrate surface will exhibit a lower wettability than the side walls inside the hole. This can be done by first depositing an oxide layer and then depositing a wetting material. The substrate is then exposed to a molten material having a suitable low resistivity, such as a metal or metal alloys. The difference in wetting capacity of the surface and the side walls in the holes, respectively, will cause the molten metal to be drawn into the holes. The described method is suitable for electronic packaging applications, comprising low resistivity, closely spaced vias. However, this approach is difficult to implement for co-fabrication of vias and silicon on insulator (Sol) sensors on the same wafer. The described approach involves creating through-wafer holes with two openings: one is on the top side of the wafer, another is on the bottom side. Having the second opening is critical to allow gas (air) to exit from the hole, while the molten metal is penetrating inside the hole. In order to adapt the discussed method for the process of co-fabricated SOI sensors with vias, where through holes are not etched, but only blind via holes in the handle substrate are fabricated, significant technology changes are required.

Through-wafer interconnects of the first group mostly have a relatively high resistance as compared to through-wafer interconnects of the second group due to the lower conductivity of silicon as compared to metal. The technology for manufacturing through-wafer interconnects of the second group has a number of limitations. Although through-wafer vias of this kind, reported earlier, have shown satisfactory performance, fabrication of high aspect ratio (better than 10:1) and ultra-low resistance (lower than 200 milli-ohm) interconnects remains problematic.

The four main challenges in the fabrication of metal, e.g. copper electroplated interconnects is uneven filling of the narrow and deep holes due to nonuniform deposition of a seed layer and insufficient wetting of the surface with copper electrolyte, leading to void formation. Besides that, most fabrication processes demonstrated previously are complex, require rather sophisticated fabrication steps, e.g. they either require deposition of multiple layers (like insulating layer/seed layer/conductive layer or insulating layer/wetting layer/conductive layer) or bonding a sacrificial wafer. High complexity of the fabrication process in many cases leads to significantly decreased yield.

BRIEF SUMMARY

It is therefore desirable to introduce new designs of through wafer interconnects to simplify the fabrication process and improve performance. Our approach addresses the challenges of interconnects assuring continuity, high aspect ratio, electrical isolation, and void-free features.

The illustrated embodiments include a high-aspect ratio low resistance through-wafer interconnect for double-sided (TWIDS) fabrication of microelectromechanical systems (MEMS). The embodiments relate to an interconnection technique for co-integration of MEMS and integrated circuits or other microcomponents utilizing both sides of the wafer. TWIDS technology is compatible with standard semiconductor processing and suitable for co-integration with released silicon-on-insulator SOI sensors, such as MEMS accelerometers, gyroscopes, and clocks. TWIDS is developed for a three dimensional folded TIMU (timing inertial measurement unit) to provide a path for electrical signals from sensors on the front side of the SOI wafer to electronic components on the back side of the wafer, while enabling folding of an array of sensors in a three dimensional shape. The spectrum of applications of this technology is broad. TWIDS process is particularly appropriate for three dimensional packaging of MEMS devices.

A batch wafer-level fabrication process for TWIDS is developed and the performance of interconnects is characterized below. The interconnects are formed by etching blind via holes in the handle substrate of a SOI wafer, followed by filling the holes with copper. The tubular-shaped or cylindrical gaps are etched around the copper filled vias to provide insulation of interconnects.

The method is directed to filling the high aspect ratio via holes with a high-conductivity material. The method is based on a sonic-assisted seedless copper electroplating process. This technique does not require additional conductive layer deposition, but utilizes a highly doped silicon device layer as a seed. TWIDS technology allows efficient utilization of the front and back side of a wafer for co-fabrication of released SOI sensors and through-wafer interconnects on wafer level in one process. Moreover, through-wafer interconnects can be incorporated while avoiding deposition of multiple layers (like insulating layer/seed layer/conductive layer or insulating layer/wetting layer/conductive layer) as well as avoiding bonding a sacrificial wafer.

Experimental analysis of an array of 22 interconnects demonstrated that the resistance values as low as 160 milli-ohms can be achieved. Parasitic capacitance of interconnects was analytically calculated and the distortion of the MEMS resonator transduction spectrum was predicted using an equivalent circuit model. Signal amplitude and phase distortion due to the parasitic capacitance are estimated to be 1.15 dB and 5.96 degrees, respectively, for the optimum 60 µm diameter via with 35 µm insulating gap.

In summary, the illustrated embodiments include a method for fabricating a through-wafer interconnect for double sided fabrication of micromechanical systems comprising the steps of providing a prepared handle wafer having a device layer formed thereon; selectively defining a blind via into an adjacent portion of the handle wafer adjacent to the device layer, the blind via extending through the adjacent portion of the handle wafer up to the device layer and having a longitudinal axis; filling the blind via with metal by seedless metal electroplating; selectively disposing a first polyimide hinge layer on the adjacent portion handle wafer; selectively disposing metal traces on the first polyimide hinge layer; disposing a second polyimide hinge layer on the metal traces and under first polyimide layer; selectively defining a cylindrical gap into the adjacent portion of the handle wafer coaxially aligned with the longitudinal axis of the blind via; disposing a carrier layer onto the second polyimide hinge layer; selectively forming at least one device feature into the device layer, handle wafer or both; and removing the second polyimide layer and carrier layer.

The step of defining a blind via into a prepared handle wafer having a device layer formed thereon, the blind via extending through the handle wafer to the device layer and having a longitudinal axis comprises defining the blind via into handle wafer having a buried oxide layer disposed in the handle wafer and between the device layer and a remaining portion of the handle wafer, the blind via being defined through the handle wafer through the remaining portion of the handle wafer up to the oxide layer.

The method further includes the steps of selectively disposing a silicon nitride/silicon dioxide hard mask on the device layer, fast reactive ion etching (FDRIE) the device layer, and selectively removing any oxide layer (TOX) using a wet etch to at least partially define a sensor in the device layer.

The method includes the steps of selectively disposing a protective photoresist layer on the silicon nitride/silicon dioxide hard mask, and etching the device layer and adjacent portion of the handle wafer to define a MEMS device feature.

The method includes the steps of removing the protective photoresist layer and etching the device layer using the previously disposed silicon nitride/silicon dioxide hard mask to complete definition of the sensor in the device layer.

The method of includes the steps of completing the etching of the adjacent portion of the handle wafer to define a MEMS device feature simultaneously with the etching the device layer using the previously disposed silicon nitride/silicon dioxide hard mask.

The method includes the steps of removing the carrier layer and second polyimide layer, and releasing the sensor in the device layer using a vapor HF process.

The step of filling the blind via with metal by seedless metal electroplating comprises filling the blind via with a conductive material using sonic-assisted seedless electroplating, where the handle wafer has a surface adjacent the filled blind via, and further comprising polishing the surface adjacent the filled blind via to remove excess electroplated material.

The step of selectively defining a blind via into an adjacent portion of the handle wafer comprises defining the blind via with anisotropic dry etching.

The step of selectively defining a cylindrical gap into the adjacent portion of the handle wafer comprises defining the cylindrical gap by anisotropic dry etching.

The step of etching the device layer using the previously disposed silicon nitride/silicon dioxide hard mask to complete definition of the sensor in the device layer and releasing the sensor in the device layer comprises patterning and releasing the sensor structure by anisotropic dry etching.

The step of selectively defining a blind via into an adjacent portion of the handle wafer adjacent to the device layer up to the device layer comprises removing a buried oxide layer inside the via by wet chemical etching, vapor chemical etching, or plasma etching.

The step of selectively defining a blind via into an adjacent portion of the handle wafer comprises disposing a mask on the adjacent portion of the handle wafer using low-pressure chemical vapor deposition (LPCVD) silicon nitride, disposing a masking layer comprised of an insulating material with a wet chemical etch rate that is lower than the etch rate of silicon dioxide, disposing a masking layer comprised of an insulating material with a vapor chemical etch rate that is lower than the etch rate of silicon dioxide, or disposing a masking layer comprised of an insulating material with a plasma etch rate that is lower than the etch rate of silicon dioxide.

The step of filling the blind via with metal by seedless metal electroplating comprises utilizing the device layer of the handle wafer as a seed without any deposit of any additional seed layer inside the via.

The step of filling the blind via with metal by seedless metal electroplating comprises using sonication during electroplating.

The step of filling the blind via with metal by seedless metal electroplating comprises using sonic-assisted seedless electroplating with copper, gold, nickel, or silver.

The step of polishing the surface adjacent the filled blind via to remove excess electroplated material comprises lapping, chemical mechanical polishing (CMP), or etching the surface adjacent the filled blind via.

The method further includes the step of filling the cylindrical gap into the adjacent portion of the handle wafer with an insulating material.

The illustrated embodiments also include within their scope an apparatus made according to any one of the embodiments of the method described above.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The disclosure can be better visualized by turning now to the following drawings wherein like elements are referenced by like numerals.

BRIEF DESCRIPTION OF THE DRAWINGS

FIG. 2a is a two dimensional depiction which shows the unfolded structure (device side), FIG. 2b is a two dimensional depiction which shows the unfolded structure (signal processing side), and FIG. 2c is a three dimensional depiction which shows a partially assembled structure with one side folded down to show both the device and signal processing sides. FIG. 2d is three dimensional side cross-sectional view of a via fabricated according to the illustrated embodiments positioned at the locations of the device side and signal processing side of the wafer indicated by the arrows from the inset of FIG. 2d to FIGS. 2a and 2b.

FIG. 5a the via hole is electroplated in a silent mode, and FIG. 5b shows the via hole electroplated in the presence of sonication.

The disclosure and its various embodiments can now be better understood by turning to the following detailed description of the preferred embodiments which are presented as illustrated examples of the embodiments defined in the claims. It is expressly understood that the embodiments as defined by the claims may be broader than the illustrated embodiments described below.

DETAILED DESCRIPTION OF THE PREFERRED EMBODIMENTS

Figure 1:
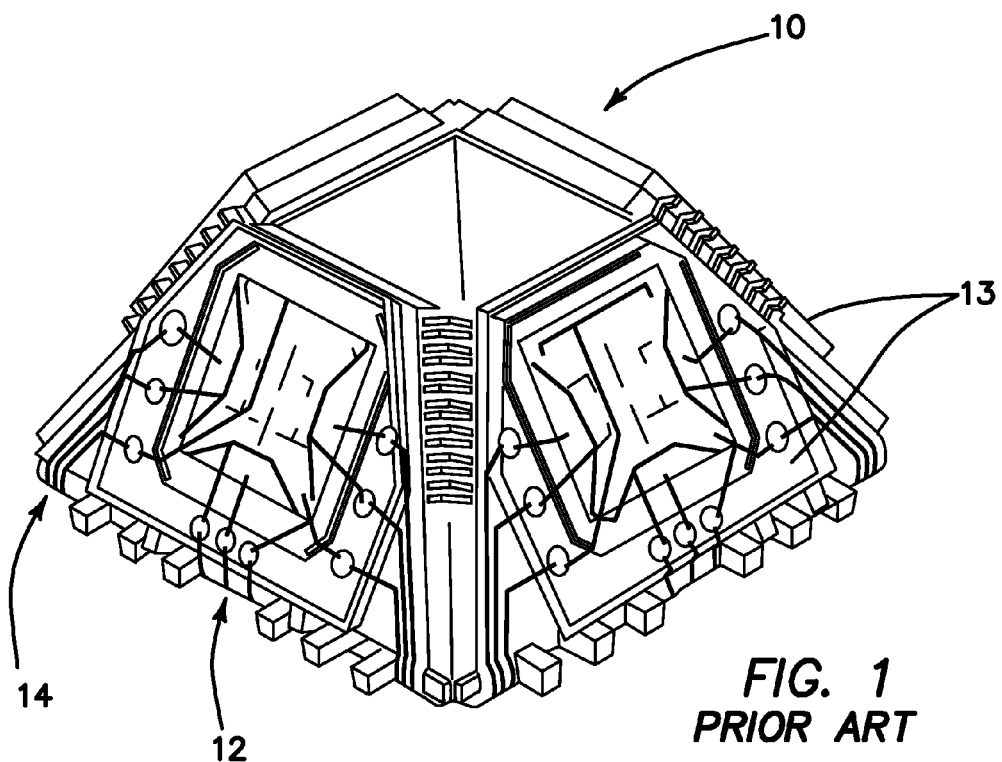
FIG. 1 is a three dimensional depiction of a prior art MEMS single-sided folded IMU.

The current state of the art is compatible with a folded MEMS fabrication process and may enable three dimensional folded TIMU (timing and inertial measurement unit) structures 10 with through-wafer interconnects 14 such as depicted in FIG. 1 In folded TIMU structures 10, through-wafer inter connects 14 provide a path for electrical signals from sensors 19 on the device side 15 of the wafer 17 to ASIC (application-specific integrated circuit) components 23 on the back side or signal processing side 13 of the wafer, and allow at the same time for assembly of the integrated MEMS sensor cluster in a three dimensional configuration, or folding it in a three dimensional shape shown in FIG. 1.

Consider a single-sided approach for folded TIMU fabrication. U.S. Pat. No. 8,368,154, incorporated herein by reference, describes a method to implement a 6-axis IMU (inertial measurement unit) on a single substrate using a folded MEMS approach. The proposed method utilizes a three dimensional foldable silicon-on-insulator (SOI) structure with in-situ fabricated inertial sensors on side 15 as shown in the prior art diagram of FIG. 1. A planar structure is fabricated and subsequently folded in a pyramidal shape, forming a compact IMU 10. The high aspect-ratio single-axis sensors are fabricated on wafer level on the top side 13 of the wafer, followed by fabrication of flexible hinges 12 that allow the dies to fold together and lock in place. Electrical interconnects 14 are formed on the same side 13 of the wafer and serve to transmit signals from each sidewall to a base of the structure, and serve as an interface between a plurality of sensors and external signal conditioning circuitry.

In the first step of the fabrication process for the folded IMU pyramid of FIG. 1, the flexible hinges 12 are formed. Photo-definable polyimide is deposited onto a substrate and then a pattern is photolithographically defined. Once the polyimide is cured, the metal traces are formed on top of the polyimide using an e-beam evaporation process and lift-off technique. Next, individual SOI sensors are defined on the same side of the SOI wafer, and the DRIE process is used to etch through the entire device layer using the photoresist as an etch mask. The next step of the process includes protecting of the top surface with photoresist and a blue tape, and then bonding the SOI wafer to the carrier. Backside etching is then performed using DRIE until the handle wafer is completely etched in the defined trenches.

In the next step of the fabrication process, the carrier wafer is removed and the sensors are released into 20% hydrofluoric acid (HF). After successfully releasing all sensors, fabrication of the folded MEMS IMU structures is complete and the devices are ready for packaging. The folded IMU approach allows for wafer-level manufacturing of IMUs with in situ SOI sensors. Along with all the advantages of the single-sided folded IMU approach, including a relatively simple 4-mask fabrication process, IMU small size and structural rigidity, as well as compatibility with wafer-level packaging process, several challenges still should be considered.

First, the thick layer of polyimide on the top surface limits the lithography accuracy and the performance of the inertial sensors. A second issue is the difficulty of completely eliminating the photoresist layer from the sensors after the fabrication is finished. During the backside etch process, the temperature of the wafer is elevated to approximately 100° C. or greater, and thus baking the photoresist layer during the entire backside etch. None of the commonly used aggressive cleaning methods can be used because of the delamination of the metal traces and polyimide that occurs. This significantly decreases the yield of the overall process. Additionally, the inner volume of the folded structure cannot be used for co-integration with signal processing electronics since all the metal traces are located on the front side and through-wafer interconnects are not available.

Therefore, it is desired to develop an alternative double-sided TIMU approach, providing the following advantages: improved sensor performance, increased process yield, and wafer-level integration with signal processing electronics.

Figure 2A:
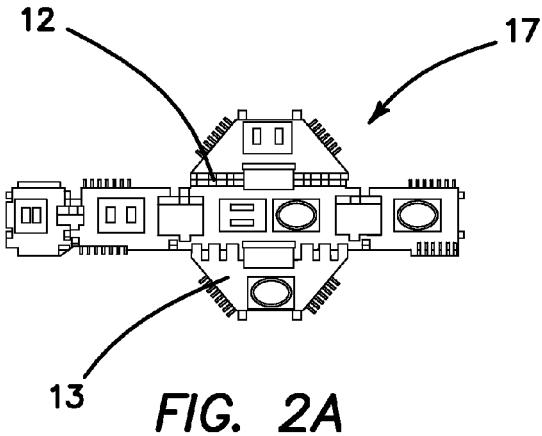
FIGS. 2a-2d are photographic depictions of a MEMS double-sided folded TIMU integrated with a TWIDS process.
Figure 2B:
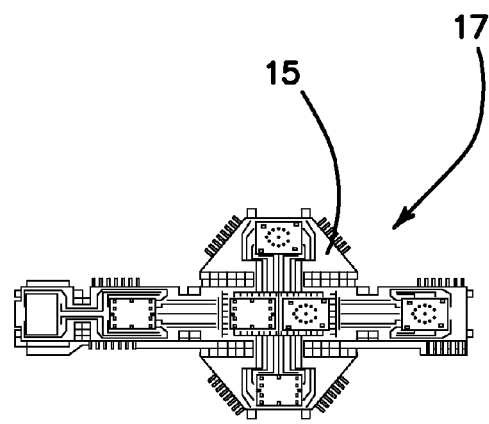
Figure 2C:
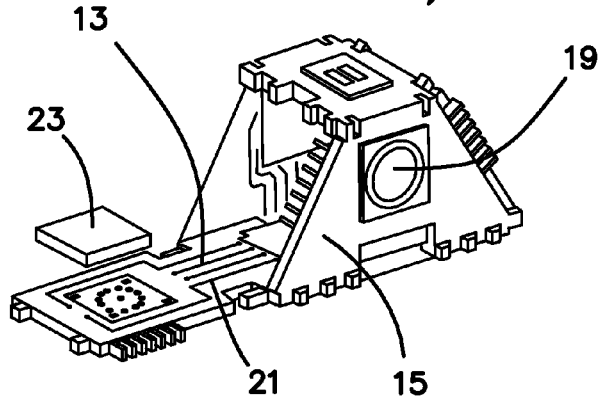
Figure 2D:
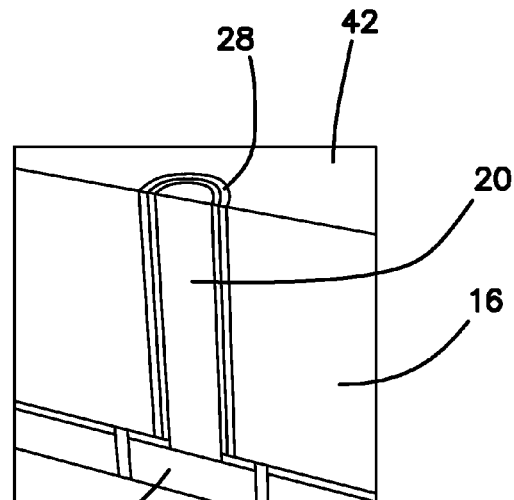

Turn now to a double-sided method for folded TIMU fabrication with TWIDS as included in the illustrated embodiments of the invention. In order to improve the performance of the sensors 19 and increase the overall yield of the TIMU devices 10 shown generally in FIGS. 2a-2c, a novel double-sided approach for fabricating a folded TIMU with through-wafer interconnects 14 for double-sided (TWIDS) use is presented. The illustrated method is based on wafer-level fabrication of the flat TIMU structures with inertial sensors 19 on one side of the wafer (a device side 15) and metal traces 21 on the opposing side (a signal processing side 13) for further integration with electronics. TWIDS use technology enables electrical interfacing of the sensors 19 on the front or device side 15 side via through-wafer interconnects 14 to electronic components 23 disposed on signal processing side 13 and inside an exemplary folded three dimensional structure of the folded TIMU 10 as shown in FIG. 2c.

Figure 3A:
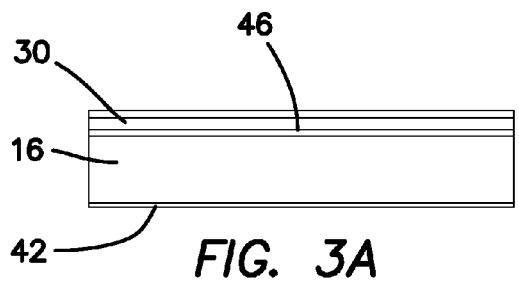
FIGS. 3a-3h are side cross-sectional flow diagrams showing the steps of the process for fabricating a double-sided folded TIMU with TWIDS fabrication.
Figure 3E:
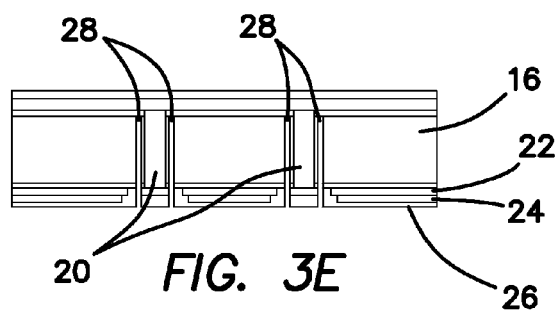
Figure 3B:
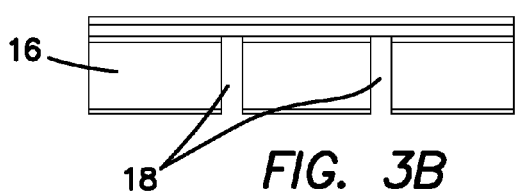
Figure 3F:
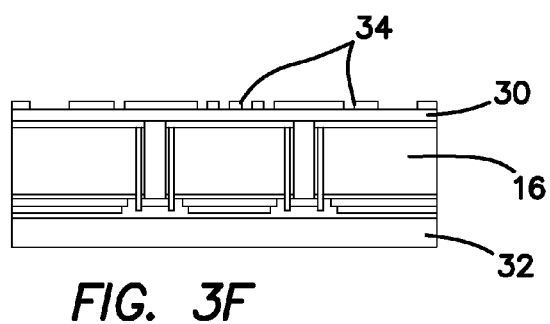
Figure 3C:
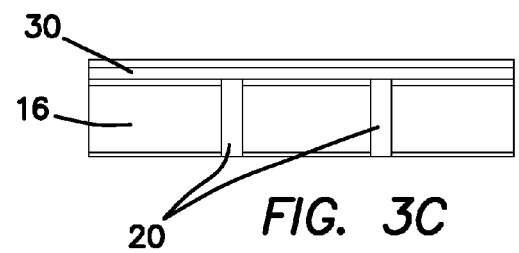
Figure 3G:
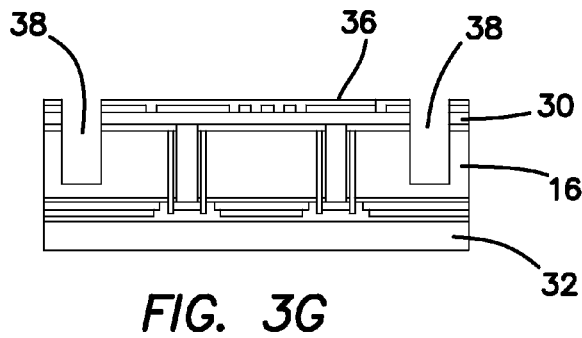
Figure 3D:
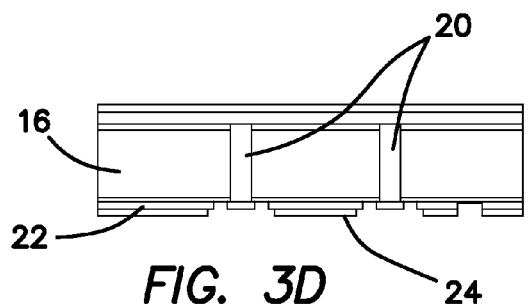
Figure 3H:
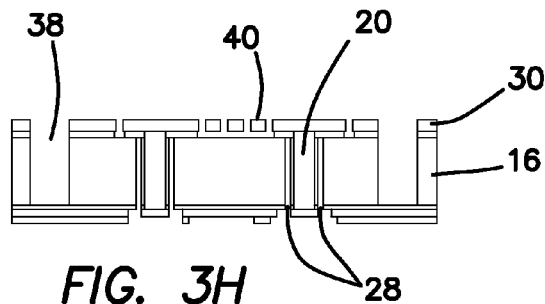

The process flow for a folded TIMU 10 with TWIDS is shown in FIGS. 3a-3h. The process flow starts with deposition of a masking layer 42 of 1 μm thick low stress LPCVD silicon nitride layer 42 under a handle wafer 16 and a top oxide layer, TOX, as seen in FIG. 3a. The silicon nitride layer 42 serves as an insulating layer for vias fabrication, preventing parasitic copper deposition on the surface of the handle wafer 16. Next, through-wafer copper vias 18 are fabricated using a seedless copper electroplating method as seen in FIGS. 3b and 3c, as well as in the process of FIGS. 4a-4f. In FIG. 3b, a plurality of vias 18 are first defined using a 500 μm DRIE etch followed by an HF etch of a buried oxide layer 46 disposed between the top portion of the handle wafer 16 and the device layer 30. A plurality of electroplated copper pieces 20 are then inserted using electroplating into the plurality of via holes 18 as seen in FIG. 3c. Next a plurality of polyimide flexible hinge layers 22 are deposited beneath the layer of silicon nitride 42. A plurality of gold traces 24 are in turn deposited beneath the polyimide flexible hinge layer 22 using a lift off technique to be produce the production step seen in FIG. 3d. Specifically, a layer of solid photoresist (not shown) is applied and lithographically patterned to define metal traces features. Next, physical vapor deposition (PVD) is performed using electron beam evaporation to create the desired metal layers 24. The metal layers 24 comprise a 500 Å adhesion layer of chrome followed by a 5000 Å layer of gold as seen in FIG. 3d. Following via fabrication, a second polyimide layer 26 is deposited beneath the flexible hinges 22 and gold traces 24 in FIG. 3e. A plurality of insulating gaps 28 are then defined in the handle wafer 16 with a 500 μm DRIE etch on either side of each electroplated copper piece 20 as seen in FIG. 3e. Next, a carrier wafer 32 is bonded to the second polyimide layer 26. Then in the first step to process the device layer 30, the features 38 of the foldable TIMU 10 are defined. This is specifically done by creating a silicon nitride/silicon dioxide hard mask 34, then etching the device layer 30 using fast reactive ion etching (FDRIE) and then removing buried oxide using a wet etch to produce the fabrication step seen in FIG. 3f. A photoresist protective layer 36 is deposited over the hard mask 34. The device layer 30 and handle wafer 16 are etched to produce MEMS, CMOS or other device features 38 as seen and FIG. 3g. In the next step, the photoresist layer 36 is removed and the device layer 30 is etched using the hard mask 34 which was previously defined in a previous fabrication step. The last 100 μm of the handle wafer 16 then are etched in parallel. Finally, the carrier wafer 32 and second polyimide layer 26 are removed and a plurality of sensors 40 in the device layer 30 are released using a vapor HF process to produce the fabrication step seen in FIG. 3h.

The main advantages of new approach for double-sided folded TIMU 10 with TWIDS compared to a single-sided approach include:

1. The process steps for fabricating the through-wafer interconnects enable connection to interface devices on the front surface to the internal volume occupied by the CMOS signal detection electronics. This approach provides a path for the further miniaturization of the TIMU with signal processing electronics.
2. Deposition of the polyimide layer(s) on backside of the fabrication wafer enables an accurate lithography and hence the higher performance of the inertial sensors
3. Subsequently depositing the photoresist layer, etching the hard mask for the sensors, and removing the photoresist prior to the subsequent device layer etch eliminates the problem of backing the resist during DRIE and cleaning the sensors after the etch is complete 4. The step of etching the sensor is moved to the end of the process in order to eliminate covering sensors with photoresist during the etching of the top surface.

Once the fabrication process is complete, the TIMU devices 10 are assembled into a three dimensional system seen in FIG. 2c providing the spatial orientation required for inertial measurement along multiple independent axes. The internal volume of the three dimensional TIMU structure 10 is equipped with signal detection electronics. TWIDS fabrication enables higher performance of the TIMU inertial sensors, higher yield and allows for further system miniaturization by efficient utilization of the inner volume.

Figure 4A:
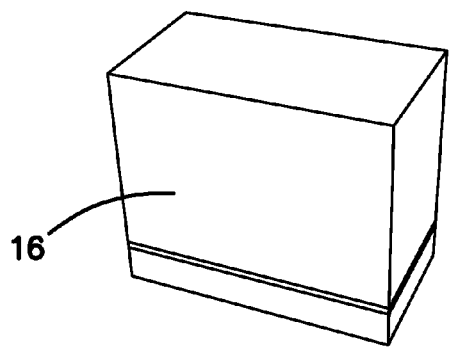
FIGS. 4a-4f are three dimensional photographic flow diagrams of the TWIDS fabrication process steps, showing in FIG. 4a the SOI wafer, FIG. 4b the LPCVD silicon nitride deposition, FIG. 4c defining through-wafer holes, FIG. 4d seedless copper electroplating and lapping, FIG. 4e defining insulating gaps, and FIG. 4f defining sensor features.
Figure 4D:
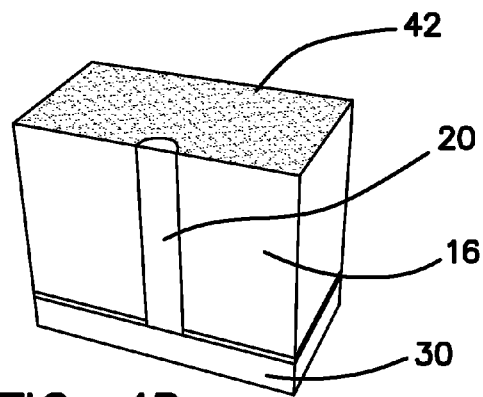
Figure 4B:
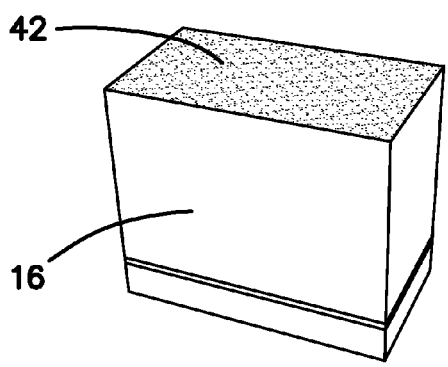
Figure 4E:
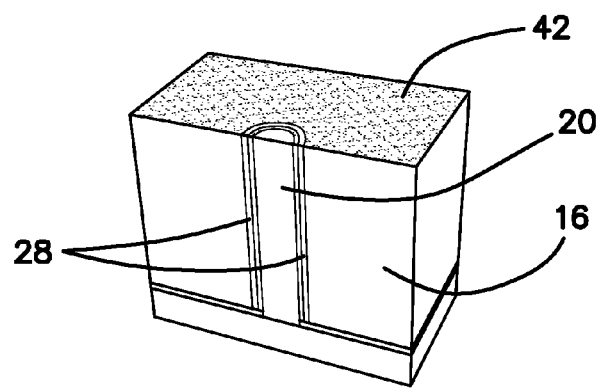
Figure 4C:
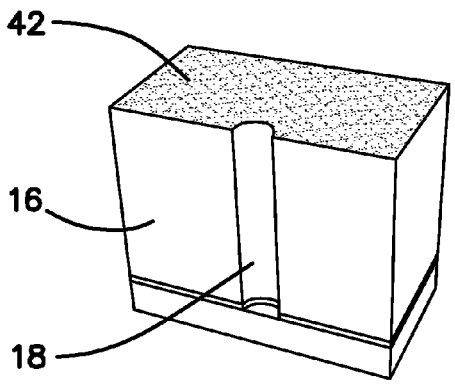
Figure 4F:
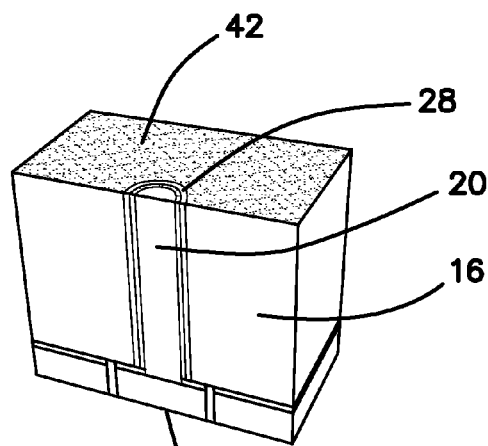

Greater understanding of the through-wafer interconnects for double-sided (TWIDS) fabrication of microelectromechanical systems may be had be turning to FIGS. 4a-4f, where the process of fabricating the TIMU 10 is illustrated in a depiction inverted from what is shown in FIGS. 3A-3H. FIG. 4a shows a 600 µm thick handle wafer 16 which serves as the substrate of the TIMU 10. The fabrication of the TIMU 10 with TWIDS begins with the deposition of a 1 µm thick layer of low stress LPCVD silicon nitride layer 42 on the surface of the handle wafer 16 as seen in FIG. 4b. 40, 60 and 80 µm diameter blind via holes 18 are sequentially etched in the handle wafer 16 using deep reactive ion etching (DRIE). The etching is followed by removal of 5 µm buried oxide layer as best seen in FIG. 4c. The via holes 18 are filled with copper using seedless copper electroplating 20 that does not require additional conductive layer deposition, but utilizes a highly doped silicon device layer 30 as a seed in FIG. 4d. The wafers 16 are lapped to prepare for the next lithography step where 30 µm insulating gaps 28 are etched around the copper filled vias 18 in FIG. 4e. Finally, as seen in FIG. 4f, the sensor's features 34 are defined on the top side of the wafer 16.

Figure 5A:
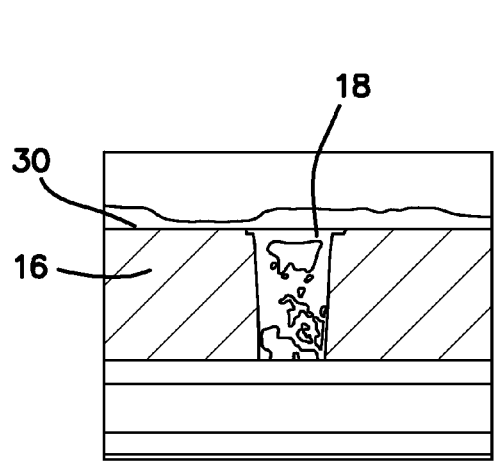
FIGS. 5a and 5b show the effect of using sonication in a seedless copper electroplating process.
Figure 5B:
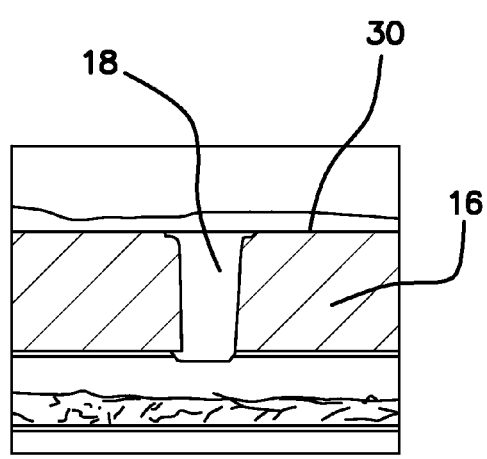

To improve the quality of the copper filled TIMU 10 with TWIDS, different conditions for copper electroplating were explored. FIGS. 5a and 5b illustrate a cross-sectional view of the via holes 18 of the TIMU 10 with TWIDS electroplated without sonication and with sonication, respectively. SEM analysis reveals that in a silent mode the electroplating solution could not penetrate into the high-aspect ratio via holes 18. As the result, the via holes 18 were not completely filled with copper as seen in FIG. 5a. We observed in our experiments that the sonication at a frequency of 37 kHz during the electroplating process significantly improved the filling, allowing for high aspect ratio voids-free interconnects as seen in FIG. 5b.

Figure 6:
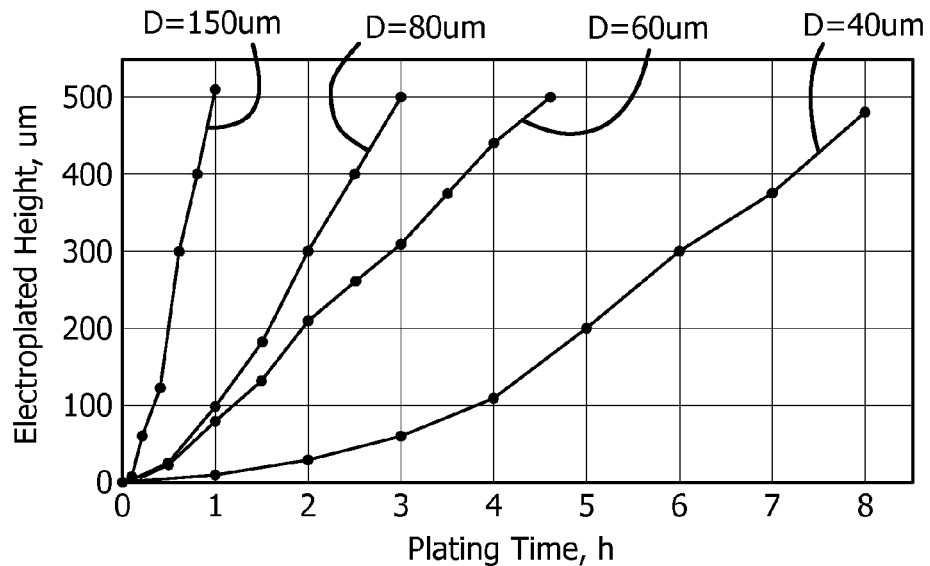
FIG. 6 is a graph showing the dependence of the copper electroplating rate, namely the electroplated height as a function of plating time, on the via hole diameter.

FIG. 6 illustrates the dependence of the electroplating rate on the via hole 18 diameter. During the electroplating experiments the effect of parasitic copper growing on the surface of the handle wafer 16 was observed. The handle handle wafer 16 had a resistivity of 1 ohm-cm, which was 1000 times higher than the resistivity of the device layer 30 (0.001-0.003 ohm-cm). However, after about a 30 mm of plating more than a 5 µm thick layer of copper 20 was deposited on the bottom of the via holes 18 and the handle wafer 16 became electrically connected to the device layer 30. At this point copper 20 started growing on the surface of the handle wafer 16. Different strategies for protecting the surface of the wafer 16 from parasitic copper growing were explored. The simplest way is to use photoresist as a masking layer. A thick layer of photoresist 36 was used as a mask for the DRIE etching of via holes 18. After the etching was completed we did not strip the photoresist 36 but instead used it for the copper plating process. However the photoresist 36 was partially destroyed during the wet HF etching of buried oxide. In addition, sonication caused some microcracks in the photoresist layer 36. As a result, the amount of copper 20 growing on the wafer 16 surface was decreased but the effect of parasitic copper growing was not completely eliminated. Another option is to use a silicon nitride mask 34 as a masking layer for copper plating. This method allowed to significantly improve the electroplating process. No parasitic copper growth was observed outside the via holes 18.

Figure 7:
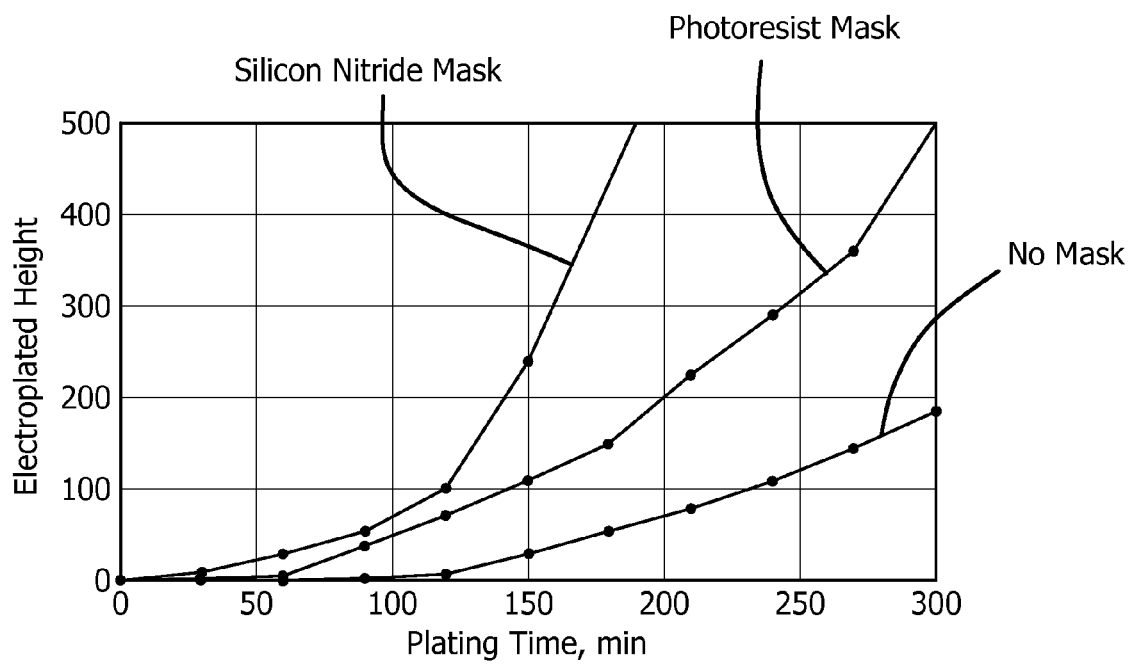
FIG. 7 is a graph showing the dependence of electroplating height on the plating time for various mask conditions.

The plot in the graph of FIG. 7 represents the measured electroplated height as a function of time for samples with and without a mask 34. A silicon nitride hard mask 34 appeared to be the best solution to prevent parasitic copper deposition on the surface of the handle wafer 16. The uniform filling was achieved at a significantly reduced plating time.

Figure 8:
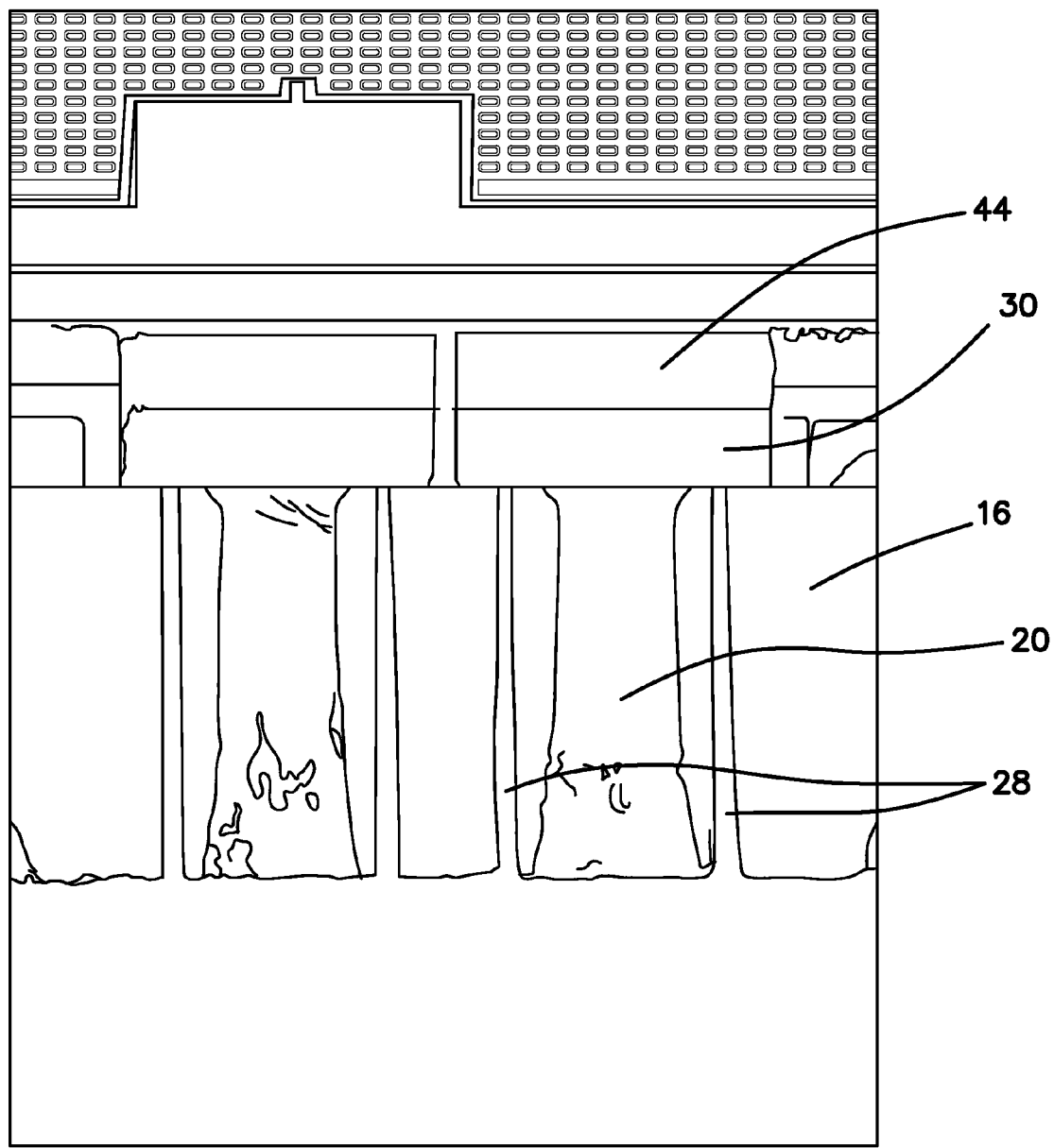
FIG. 8 is a SEM microphotograph of a MEMS inertial sensor with co-fabricated TWIDS.
Figure 9:
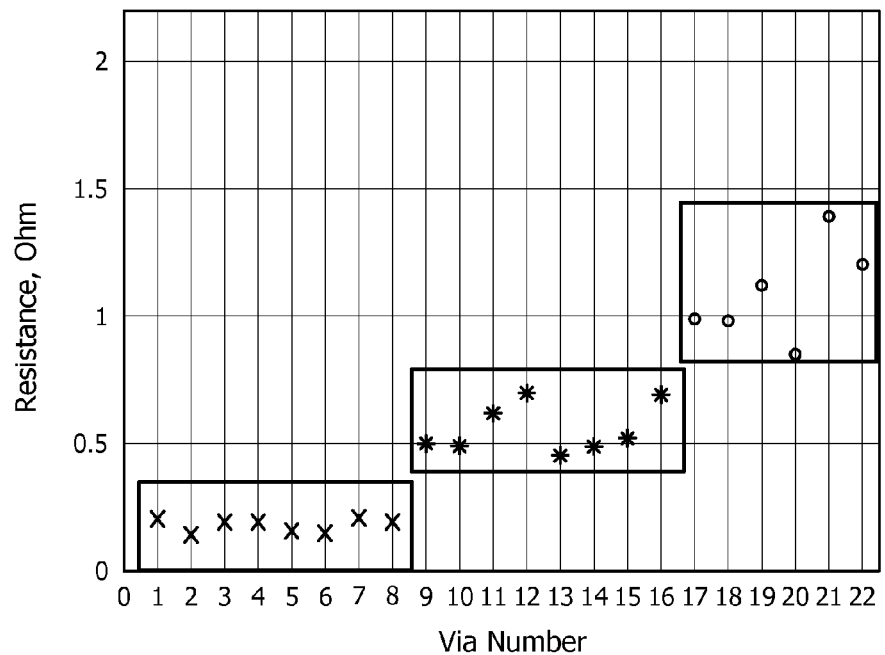
FIG. 9 is a table showing the resistance measurement for 22 interconnects, showing resistance less than 164 milliohms for 100 μm copper filled via.

A magnified view of a TIMU 10 with co-fabricated TWIDS is shown in FIG. 8. Probe tests revealed that the sensor contact pads 44 were insulated. Experimental analysis of 22 interconnects of the diameters ranging from 40 to 80 microns showed resistance values as low as 160 milliohm as shown in the graph of FIG. 9. Parasitic capacitance may have a detrimental effect on the performance of MEMS inertial sensors with TWIDS. Implementation of an open-loop characterization technique for a microsensor is a challenging task mainly because a relatively tiny motional current of the sensor is masked by parasitic feedthrough currents. There are a number of sources contributing to parasitic capacitance, including probe-to-probe capacitive feedthrough, pad-to-substrate capacitance, fringing field capacitance, and TWIDS capacitance as schematically illustrated in the equivalent circuit model of FIG. 10. TWIDS parasitic currents arise from through-wafer silicon vias 18, which are surrounded by insulating gaps 28 and form capacitors with the silicon substrate 16.

Figure 10:
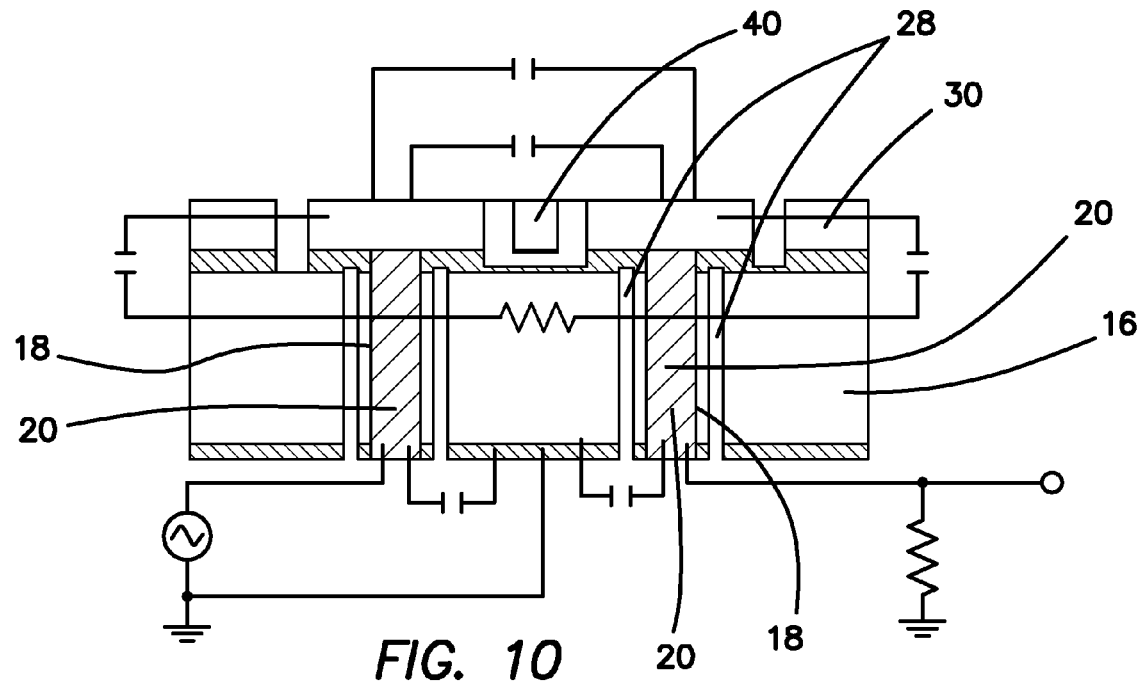
FIG. 10 is a side cross-sectional diagram and measurement of an equivalent circuit model whose performance is graphed in FIGS. 11a and 11b.
Figure 11A:
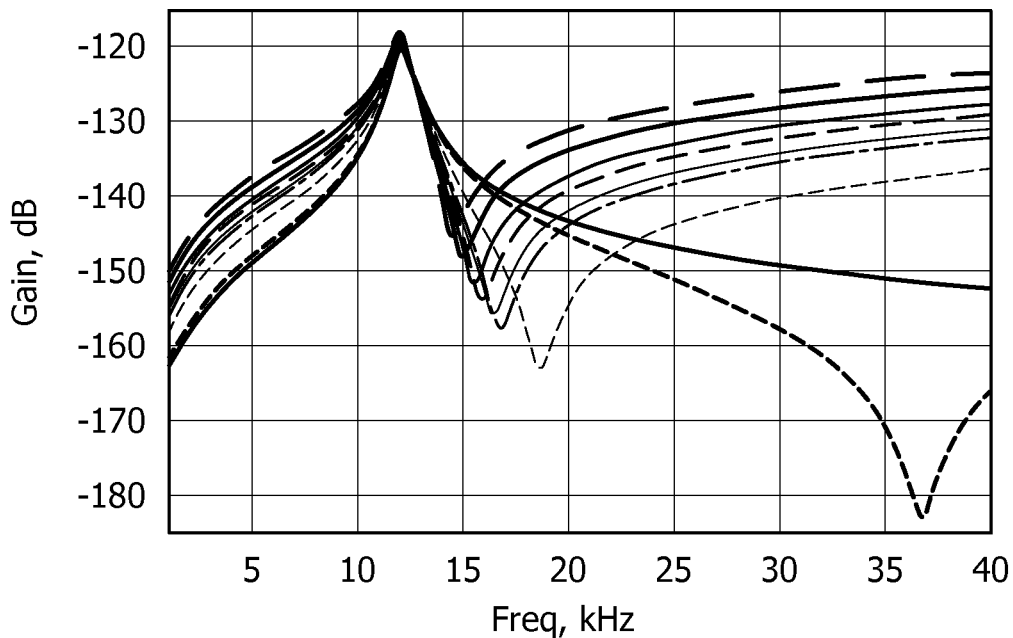
FIGS. 11a and 11b are graphs showing the amplitude and phase distortion respectively as a function of frequency for an electrostatically driven microsensor, as predicted by its equivalent circuit model of FIG. 10, for an ideal case, probe-to probe parasitic capacitance, substrate capacitance, and TWIDS capacitance.
Figure 11B:
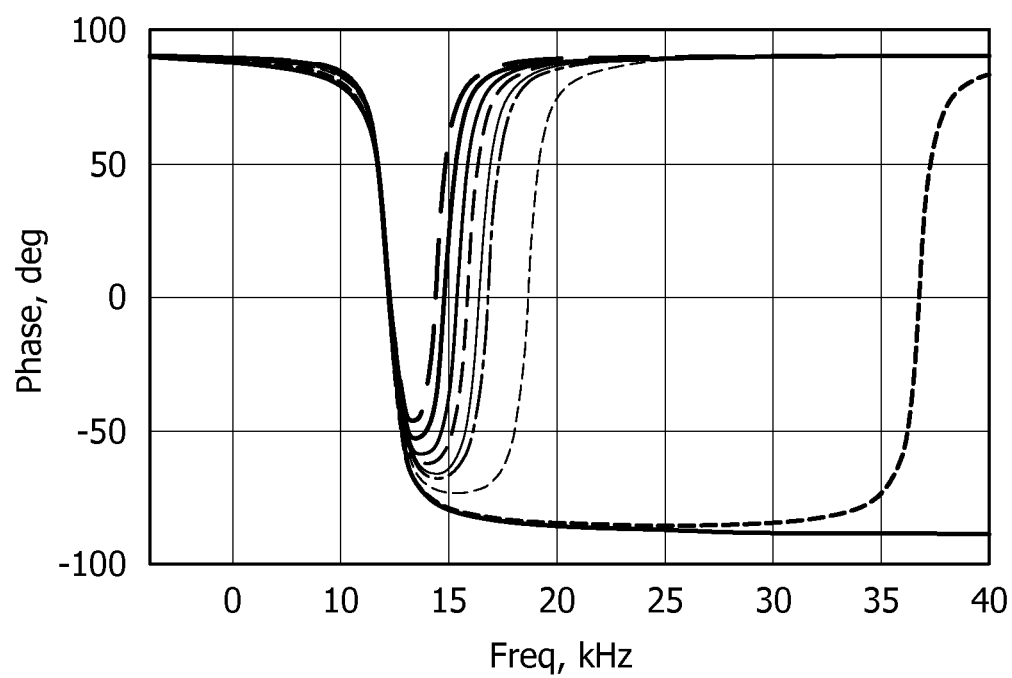
Figure 12A:
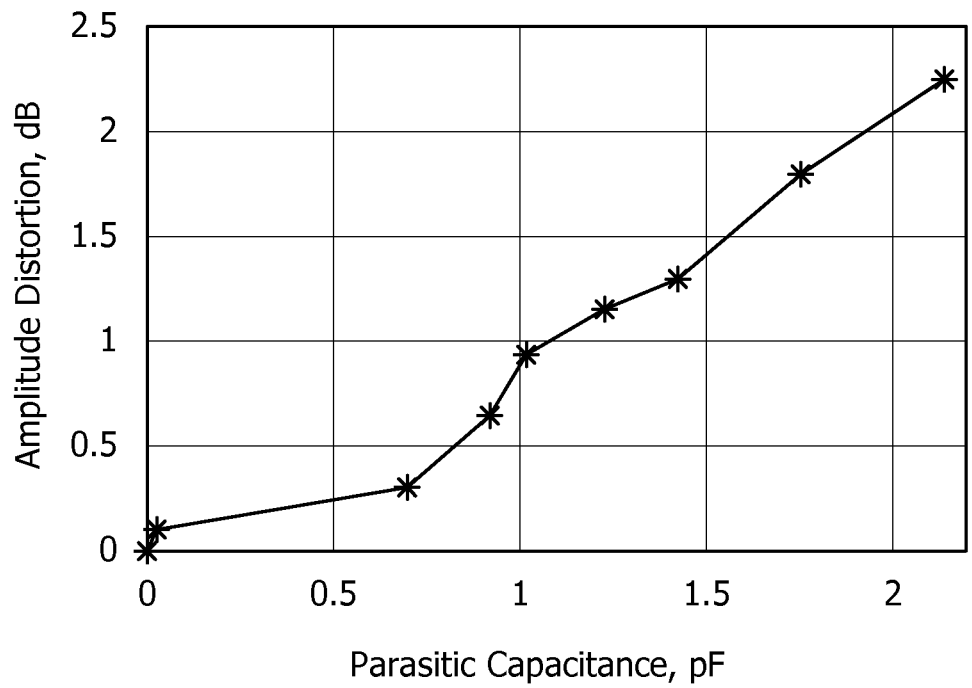
FIGS. 12a and 12b are graphs which show the amplitude and phase distortion respectively due to parasitic currents, as predicted by equivalent circuit model.
Figure 12B:
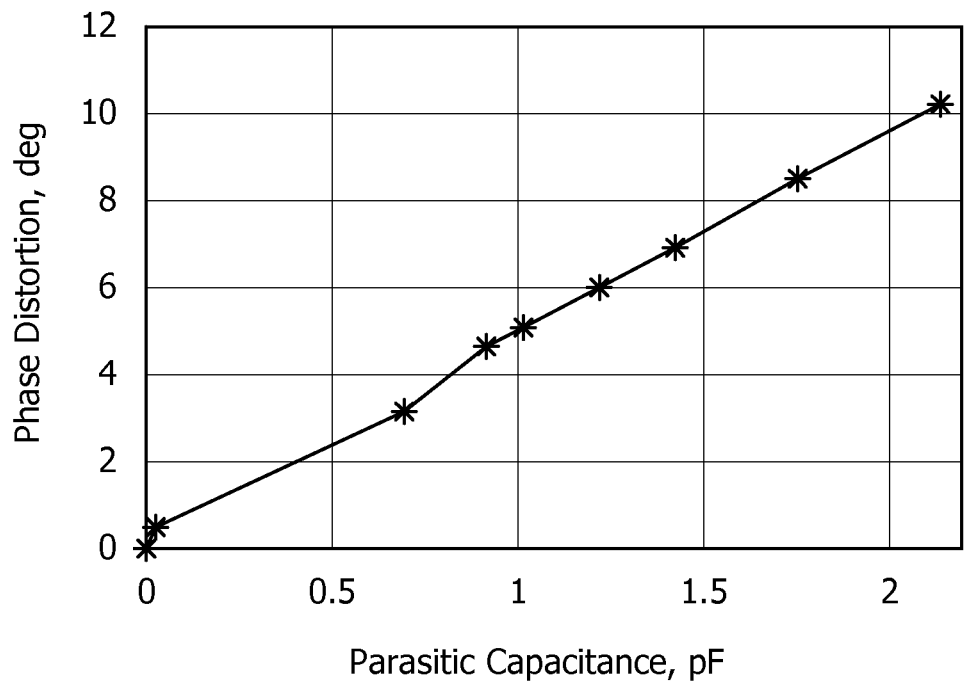

Simulation in LTspice using the equivalent circuit elements for a microsensor, biased and excited as seen in FIG. 10, yields the transduction spectrums shown in FIGS. 11A and 11B. Based on the simulation, the transduction spectrum of a MEMS sensor was plotted under ideal conditions and with consideration of different sources contributing to parasitic feed through. In order to optimize the parameters of the TWIDS process, the through-wafer interconnects parasitic capacitance was estimated for different widths of insulating gaps 28 in the range of 15-55 µm and the contact pads in the range of 170-250 µm. FIGS. 12a and 12b show that the signal distortion due to via parasitic capacitance increases with the decrease of the insulating gap 28 and achieves 2.25 dB for amplitude and 10 degree for phase distortion in the case of 15 µm insulating gap.

The design of the TWIDS involves a series of trade-off decisions, such as insulating gap 28 width, via hole diameter, silicon dioxide undercut area, and electrical contact pad size. The electrical contact pad size should not exceed 100-250 µm for most MEMS sensors applications. In order to minimize the size of the contact pad 44, the via hole 18, insulating gap 28, and the silicon dioxide undercut area should be minimized. However, these parameters are limited by the existing MEMS manufacturing tolerances. The via hole diameter and an insulating gap size are limited by the DRIE technology with an aspect ratio of in the order of 20:1 in our implementation. Silicon dioxide undercut area should be larger than 30 µm to allow for the successful release of the sensors 40. The optimum parameters for TWIDS 10 are summarized in Table 1 below.

TABLE 1

Optimum parameters for TWIDS

| Parameter | Symbol | Value | Unit |
|---|---|---|---|
| Contact pad size | D | 210 | um |
| Handle wafer thickness | L | 500 | um |
| Device layer thickness | I | 100 | um |
| Via hole diameter | d | 60 | um |
| Insulating gap | g | 35 | um |
| Silicon dioxide undercut area | s | 30 | um |
| TWIDS resistance across vertical connection | R | 0.71 | Ohm |
| Signal amplitude distortion due to TWIDS parasitic capacitance | $\Delta A_{TWIDS}$ | 0.65 | dB |
| Signal phase distortion due to TWIDS parasitic capacitance | $\Delta p_{TWIDS}$ | 2.06 | dB |
| Signal amplitude distortion due to parasitic capacitance | $\Delta A$ | 1.15 | dB |
| Signal phase distortion due to parasitic capacitance | $\Delta p$ | 5.96 | dB |

For the optimum electrical contact pad 44 of 210 μm with a 60 μm via hole diameter and a 35 μm insulating gap 28, the TWIDS resistance across the vertical interconnects was experimentally demonstrated to be better than 710 milli-ohms. The signal distortion due to TWIDS parasitics was estimated analytically not to exceed 0.65 dB for amplitude and 2.06 degrees for phase, which is suitable for MEMS applications. This is a good compromise compared with signal distortion due to other sources of parasitics, including pad-to-substrate capacitance, probe-to-probe capacitance and fringing field capacitance (0.5 dB for amplitude and 3.9 degree for phase).

A TWIDS technology for fabrication of high density array of through-wafer interconnects with resistance better than 710 milli-ohm for a 60 μm diameter via 18 and better than 164 milli-ohm for a 100 μm diameter via 18 has been presented. The TWIDS process is compatible with standard semiconductor processing, and suitable for co-integration with silicon sensors, such as MEMS accelerometers, gyroscopes, and clocks. TWIDS was developed for the three dimensional folded TIMU 10 to provide a path for electrical signals from sensors 40 on the front side 12 of the SOI wafer to electronic components on the back side 14 of the wafer. The spectrum of applications of this technology is broad, and the TWIDS process is particularly appropriate for three dimensional packaging of MEMS devices. As a demonstration of using the TWIDS technology, MEMS sensors with 210 μm contact pads have been integrated on a silicon wafer.

Many alterations and modifications may be made by those having ordinary skill in the art without departing from the spirit and scope of the embodiments. Therefore, it must be understood that the illustrated embodiment has been set forth only for the purposes of example and that it should not be taken as limiting the embodiments as defined by the following embodiments and its various embodiments.

Therefore, it must be understood that the illustrated embodiment has been set forth only for the purposes of example and that it should not be taken as limiting the embodiments as defined by the following claims. For example, notwithstanding the fact that the elements of a claim are set forth below in a certain combination, it must be expressly understood that the embodiments includes other combinations of fewer, more or different elements, which are disclosed in above even when not initially claimed in such combinations. A teaching that two elements are combined in a claimed combination is further to be understood as also allowing for a claimed combination in which the two elements are not combined with each other, but may be used alone or combined in other combinations. The excision of any disclosed element of the embodiments is explicitly contemplated as within the scope of the embodiments.

The words used in this specification to describe the various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the embodiments.

We claim:

1. A method for fabricating a through-wafer interconnect for double sided fabrication of micromechanical systems comprising:

providing a prepared handle wafer having a device layer formed thereon;

selectively defining a blind via into portion of the handle wafer that is adjacent to the device layer, the blind via extending through of the handle wafer up to the device layer and having a longitudinal axis;

filling the blind via with metal by seedless metal electroplating;

selectively disposing a polyimide hinge layer on the handle wafer;

selectively disposing metal traces on the polyimide hinge layer;

disposing a photoresist protection layer on the metal traces on the polyimide hinge layer;

selectively defining a cylindrical gap into the portion of the handle wafer that is adjacent to the device layer, the cylindrical gap being coaxially aligned with the longitudinal axis of the blind via;

disposing a carrier layer onto the photoresist protection layer;

selectively forming at least one device feature into the device layer, handle wafer or both; and removing the photoresist protective layer and carrier layer.

2. The method of claim 1 where defining a blind via into a prepared handle wafer having a device layer formed thereon, the blind via extending through the handle wafer to the device layer and having a longitudinal axis comprises defining the blind via into handle wafer having a buried oxide layer disposed in the handle wafer and between the device layer and a remaining portion of the handle wafer, the blind via being defined through the handle wafer through the remaining portion of the handle wafer up to the oxide layer.

3. The method of claim 1 further comprising selectively disposing a silicon nitride/silicon dioxide hard mask on the device layer, fast reactive ion etching (FDRIE) the device layer, and selectively removing any oxide layer (TOX) using a wet etch to at least partially define a sensor in the device layer.

4. The method of claim 3 further comprising etching the device layer and the portion of the handle wafer that is adjacent to the device layer to define a MEMS device feature.

5. The method of claim 4 further comprising etching the device layer using the previously disposed silicon nitride/silicon dioxide hard mask to complete definition of the sensor in the device layer.

6. The method of claim 5 further comprising completing the etching of the handle wafer to define a MEMS device feature simultaneously with the etching the device layer using the previously disposed silicon nitride/silicon dioxide hard mask.

7. The method of claim 6 further comprising releasing the sensor in the device layer using a vapor HF process.

8. The method of claim 6 where etching the device layer using the previously disposed silicon nitride/silicon dioxide hard mask comprises patterning and etching the sensor by anisotropic dry etching.

9. The method of claim 1 where filling the blind via with metal by seedless metal electroplating comprises filling the blind via with a conductive material using sonic-assisted seedless electroplating, where the handle wafer has a surface adjacent the filled blind via, and further comprising polishing the surface adjacent the filled blind via to remove excess electroplated material.

10. The method of claim 9 where polishing the surface adjacent the filled blind via to remove excess electroplated material comprises lapping, chemical mechanical polishing (CMP), or etching the surface adjacent the filled blind via.

11. The method of claim 1 where selectively defining a blind via into portion of the handle wafer that is adjacent to the device layer comprises defining the blind via with anisotropic dry etching.

12. The method of claim 1 where selectively defining a cylindrical gap into the portion of the handle wafer that is adjacent to the device layer comprises defining the cylindrical gap by anisotropic dry etching.

13. The method of claim 1 where selectively defining a blind via into portion of the handle wafer that is adjacent to the device layer up to the device layer comprises removing a buried oxide layer inside the via by wet chemical etching, vapor chemical etching, or plasma etching.

14. The method of claim 1 where selectively defining a blind via into portion of the handle wafer that is adjacent to the device layer comprises disposing a mask on the portion of the handle wafer that is adjacent to the device layer using low-pressure chemical vapor deposition (LPCVD) silicon nitride, disposing a masking layer comprised of an insulating material with a wet chemical etch rate that is lower than the etch rate of silicon dioxide, disposing a masking layer comprised of an insulating material with a vapor chemical etch rate that is lower than the etch rate of silicon dioxide, or disposing a masking layer comprised of an insulating material with a plasma etch rate that is lower than the etch rate of silicon dioxide.

15. The method of claim 1 where filling the blind via with metal by seedless metal electroplating comprises utilizing the device layer of the handle wafer as a seed without any deposit of any additional seed layer inside the via.

16. The method of claim 1 where filling the blind via with metal by seedless metal electroplating comprises using sonication during electroplating.

17. The method of claim 1 where filling the blind via with metal by seedless metal electroplating comprises using sonic-assisted seedless electroplating with copper, gold, nickel, or silver.

18. The method of claim 1 further comprising filling the cylindrical gap into the portion of the handle wafer that is adjacent to the device layer with an insulating material.

19. An apparatus made by the method comprising:

providing a prepared handle wafer having a device layer formed thereon;

selectively defining a blind via into portion of the handle wafer that is adjacent to the device layer, the blind via extending through of the handle wafer up to the device layer and having a longitudinal axis;

filling the blind via with metal by seedless metal electroplating;

selectively disposing a polyimide hinge layer on the handle wafer;

selectively disposing metal traces on the first polyimide hinge layer;

disposing a hinge photoresist protection layer on the metal traces on the polyimide hinge layer;

selectively defining a cylindrical gap into the portion of the handle wafer that is adjacent to the device layer, the cylindrical gap being coaxially aligned with the longitudinal axis of the blind via;

disposing a carrier layer onto the photoresist protection layer;

selectively forming at least one device feature into the device layer, handle wafer or both; and removing the photoresist protective layer and carrier layer.

* * * * *